United States Patent [19]

Hamatani

[11] Patent Number: 5,425,045
[45] Date of Patent: Jun. 13, 1995

[54] SHORT WAVELENGTH LASER OPTICAL APPARATUS

[75] Inventor: Masato Hamatani, Tokyo, Japan
[73] Assignee: Nikon Corporation, Tokyo, Japan
[21] Appl. No.: 279,072
[22] Filed: Jul. 22, 1994

Related U.S. Application Data

[63] Continuation of Ser. No. 18,721, Feb. 17, 1993, abandoned.

Foreign Application Priority Data

Feb. 28, 1992 [JP] Japan .................. 4-078601

[51] Int. Cl.⁶ ............................................. H01S 3/034
[52] U.S. Cl. ............................. 372/101; 372/57; 372/60; 359/509; 359/809
[58] Field of Search ................. 372/55, 57–60, 372/101, 103, 108, 109, 705; 359/332, 503, 507–514, 808, 809

[56] References Cited

U.S. PATENT DOCUMENTS 3,696,230 10/1972 Friedrich .................. 359/509 X
4,316,157 2/1982 Dosi et al. ..................... 372/59
4,888,786 12/1989 Davis et al. ................... 372/58
5,049,762 9/1991 Katoh ........................ 359/332

FOREIGN PATENT DOCUMENTS 2-210813 8/1990 Japan .
3-157917 10/1991 Japan .

Primary Examiner—John D. Lee
Attorney, Agent, or Firm—Shapiro and Shapiro

[57] ABSTRACT

A laser optical apparatus permits the use of a laser beam having a spectrum characteristic which substantially overlaps with an absorption band of oxygen, with a simple construction. Oxygen in a lens barrel of an optical system or a sealed space between lens barrels is absorbed by a deoxidation agent. Accordingly, even if a laser beam by an excimer laser using argon fluoride having a spectrum characteristic which substantially overlaps with the absorption of oxygen is passed through the optical system, the loss of laser energy by the absorption of oxygen, the generation of noxious gas and the swing due to the change of transmission are prevented.

19 Claims, 3 Drawing Sheets

SHORT WAVELENGTH LASER OPTICAL APPARATUS

This is a continuation of application Ser. No. 08/018,721 filed Feb. 17, 1993, now abandoned.

BACKGROUND OF THE INVENTION

1. Field of the Invention

The present invention-relates to a laser optical apparatus which is suitably applied to a laser exposure apparatus to be used in manufacturing a semiconductor integrated circuit.

2. Related Background Art

A semiconductor device such as a semiconductor integrated circuit has been increasingly microminiturized and a minimum line width of a circuit pattern is now reaching an area of quarter micron from an area of sub-micron. As a result, in a reduction projection type exposure apparatus, a projection lens having a large aperture number has been developed; but it is necessary to further shorten a wavelength of an exposure light in order to further microminiturize the semiconductor device.

To this end, an exposure apparatus which uses an excimer laser light source which generates a light of a shorter wavelength than that of an illumination light by a g-line (wavelength 435 nm) or an i-line (wavelength 365 nm) of a mercury lamp which is presently widely used in the exposure apparatus, is considered very promising.

The excimer laser light source can generate laser beams of different wavelengths by changing gas of an oscillation medium. Among others, Krypton fluoride (KrF, wavelength 248 nm) and Argon fluoride (ArF, wavelength 193 nm) which assure a stable high output and have a short wavelength are advantageous.

In order to form a finer pattern, it is desirable to use an excimer laser of as short wavelength as possible, and the excimer laser exposure apparatus which uses the ArF excimer laser having the wavelength of 193 nm rather than the KrF excimer laser having the wavelength of 248 nm is presently most promising.

However, when a laser beam of a short wavelength is passed through an optical system in an oxygen atmosphere, a cloud may appear in the optical system. The cloud of the optical system is considered to be generated by a chemical reaction of a coating on a surface of a lens in the oxygen atmosphere by the laser beam, or by the deposition to the surface of the lens of a material removed from a lens barrel by the chemical reaction.

In the KrF excimer laser exposure apparatus, it is not necessary to fill an optical path with a high transmission medium such as nitrogen gas because the absorption of a laser energy by oxygen in air when the laser beam propagates in air is negligibly small. However, when the ArF excimer laser is to be used as the exposure light source, the absorption by oxygen is significantly larger than that of KrF because the ArF excimer laser has a spectrum characteristic which substantially overlaps with an absorption band of oxygen. Thus if air (oxygen) is present in the optical path, not only the laser energy is lost but also noxious ozone gas is generated by photodecomposition of oxygen and the transmission in the laser beam path varies with time.

In order to avoid the above problem, the laser beam path may be blocked from the atmosphere and the inside thereof may be evacuated or substituted by helium He or nitrogen $N_2$. In this case, however, the exposure apparatus itself becomes complicated and of large scale.

SUMMARY OF THE INVENTION

It is an object of the present invention to provide a laser optical apparatus which does not cause a cloud in an optical system through which a laser beam is passed even if the laser beam of a short wavelength is used, and which uses the laser beam having a spectrum characteristic which overlaps with an absorption band of oxygen.

In order to achieve the above object, the laser optical apparatus of the present invention may comprise laser light source means for emitting a laser beam; optical means including a lens barrel having a plurality of lenses mounted therein for transmitting therethrough the laser beam emitted from said laser light source means; and deoxidation means arranged in a sealed space in said lens barrel of said optical means for absorbing oxygen in said sealed space.

Further, the laser exposure apparatus of the present invention may comprise laser light source means for emitting a laser beam; an illumination optical system including a lens barrel having a plurality of lenses mounted therein for irradiating the laser beam emitted from said laser light source means to a reticle having a pattern to be transferred formed thereon; a projection optical system including a lens barrel having a plurality of lenses mounted therein for focusing a projection image of said reticle onto a substrate; and deoxidation means arranged in a sealed space in at least one of said lens barrel of said illumination optical system and said projection optical system.

In accordance with the laser optical apparatus of the present invention, oxygen in a sealed space in a lens barrel of optical means is absorbed by deoxidation means so that the cloud on the surface of the lens mounted in the lens barrel is prevented even if the laser beam of a short wavelength is passed through the optical means. Further, even when the laser beam having a spectrum characteristic which substantially overlaps with the absorption band of oxygen is used, the loss of the laser energy by the absorption of oxygen, the generation of noxious gas and the swing due to the change of transmission are prevented.

In accordance with the laser exposure apparatus of the present invention, oxygen in the sealed space in the lens barrel of at least one of an illumination optical system and a projection optical system is absorbed by deoxidation means so that the cloud on the surface of the lens mounted in the lens barrel is prevented even if the laser beam of a short wavelength is passed through the illumination optical system or the projection optical system. Further, even when the laser beam having a spectrum characteristic which substantially overlaps with the absorption band of oxygen is used, the loss of the laser energy by the absorption of oxygen, the generation of noxious gas and the swing due to the change of transmission are prevented.

DETAILED DESCRIPTION OF THE PREFERRED EMBODIMENTS

One embodiment of the present invention is now explained in detail with reference to the drawings.

Figure 1:
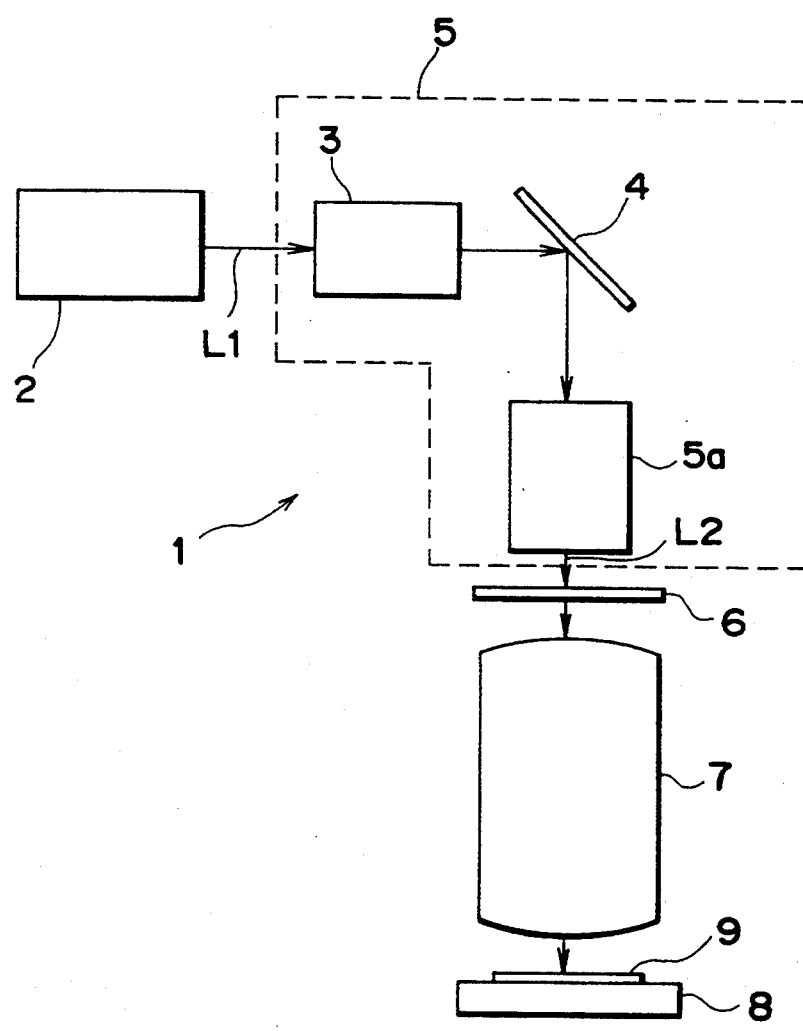
FIG. 1 shows an overall configuration of a laser exposure apparatus in accordance with one embodiment of a laser optical apparatus of the present invention.

In FIG. 1, numeral 1 denotes a laser exposure apparatus of the present invention. A laser beam L1 generated by an excimer laser light source 2 is directed to a reticle 6 through an illumination optical system 5. The laser beam L1 has a wavelength having a spectrum characteristic which substantially overlaps with an absorption band of oxygen (a band in which energy absorption by oxygen takes place).

Figure 2:
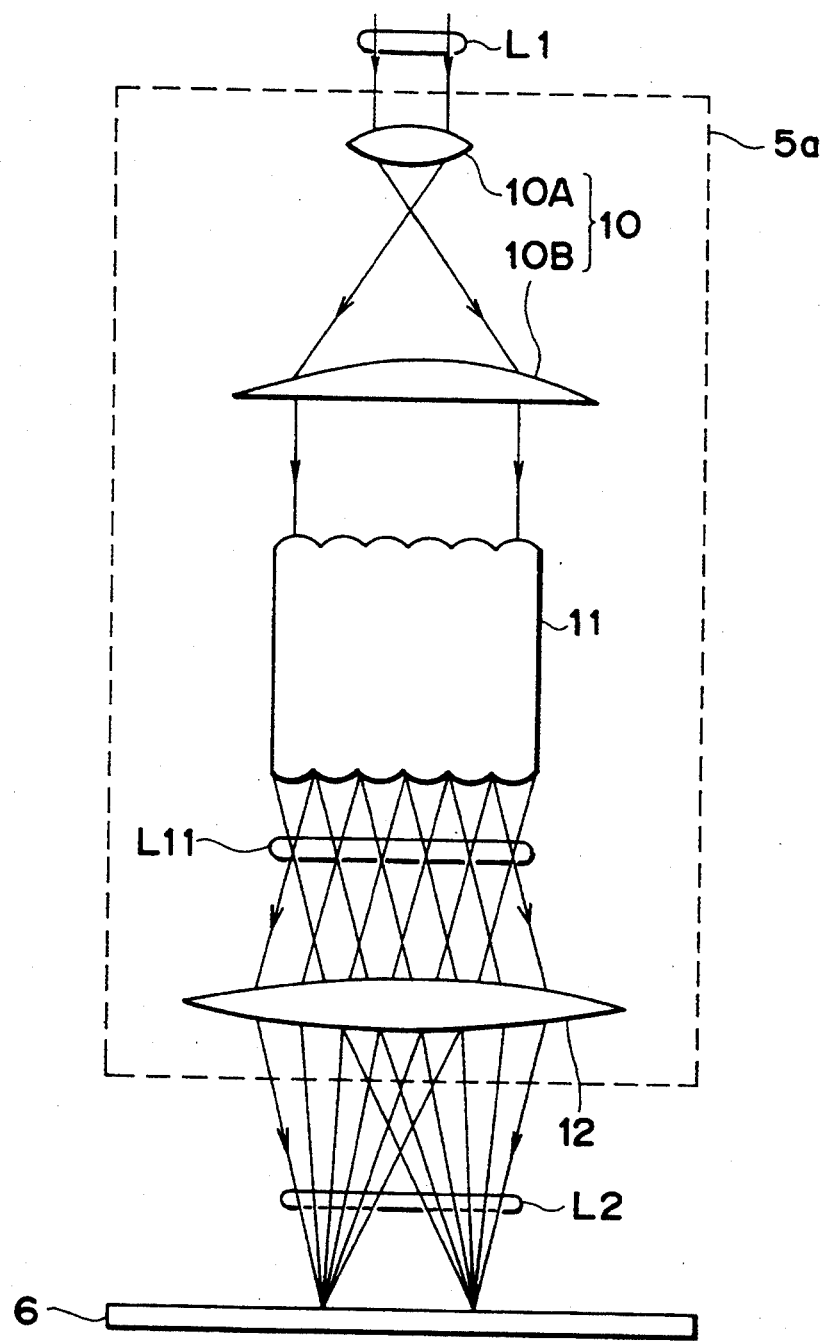
FIG. 2 shows a schematic view of a configuration of an illumination optical system in the laser exposure apparatus of FIG. 1.

The illumination optical system 5 comprises a relay lens system 3, a reflection mirror 4, an input optical system (beam expander) 10, an optical integrator 11 such as a flyeye lens and a condenser lens 12 (FIG. 2).

A laser beam L2 exiting from the illumination optical system 5 illuminates the reticle 6 with a uniform illumination distribution so that a circuit pattern on the reticle 6 is reduction-projected onto a wafer 9 mounted on a stage 8 through a projection lens 7. In this manner, the circuit pattern on the reticle 6 is formed on the wafer 9.

The portions of the illumination optical system 5 arranged between the reflection mirror 4 and the reticle 6 (which is referred to as a first illumination optical system 5a) have an optical configuration as shown in FIG. 2, and the laser beam L1 deflected by the reflection mirror 4 is directed to the flyeye lens 11 through beam expanders 10A and 10B. As a result, a group L11 of secondary light sources corresponding to the number of elements of the flyeye lens 11 are formed on the exit side of the flyeye lens 11.

The group of secondary light sources L11 are condensed by the condenser lens 12 so that when they are superimposed on the reticle 6, the laser beam L2 of a uniform illumination is generated and it illuminates the reticle 6.

Figure 3:
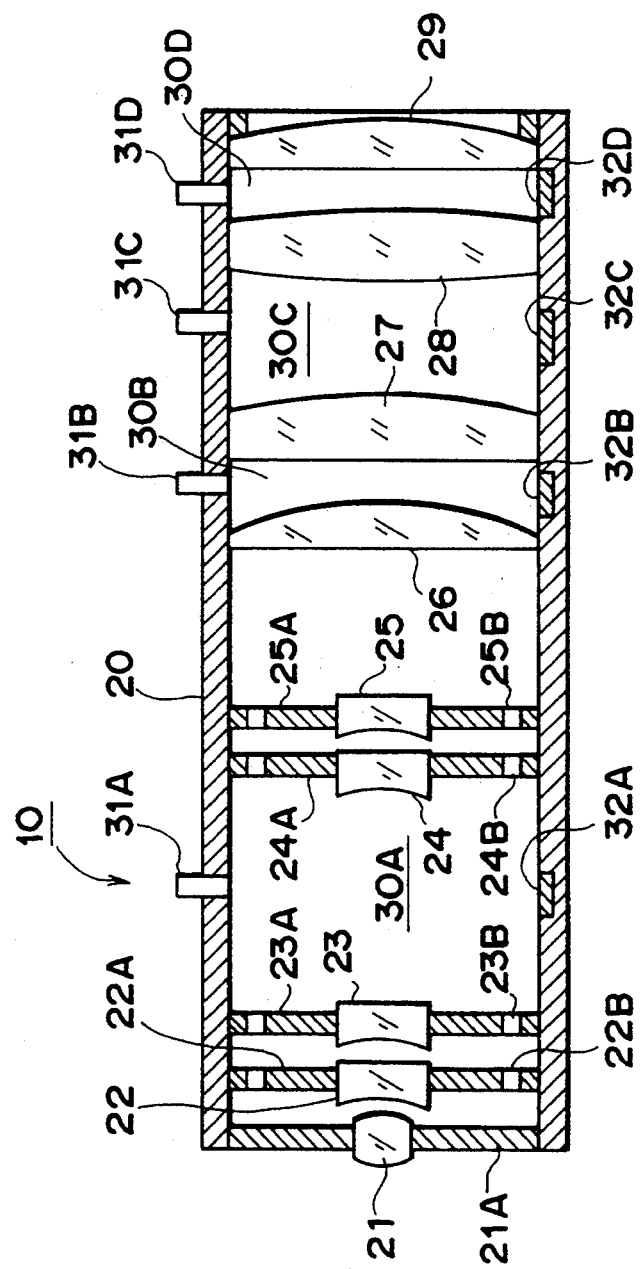
FIG. 3 shows a schematic sectional view of a lens barrel having deoxidation agent built therein as a part of the optical system in the illumination optical system of FIG. 2.

In the present embodiment, the beam expanders 10A and 10B of the first illumination optical system 5a comprise, for the purpose of compensating for an aberration of the optical system as shown in FIG. 3, nine lenses, that is, first to fifth lenses 21-25 having smaller diameters than an inner diameter of the lens barrel 20, and sixth to ninth lenses 26-29 having equal diameter to the inner diameter of the lens-barrel 20.

The first to fifth lenses 21-25 are fixed to the lens barrel 20 by first to fifth lens frames 21A-25A, and the sixth to ninth lenses 26-29 are fixed to the lens barrel 20 by O-rings.

Apertures 22B-25B are formed in the second to fifth lens frames 22A-25A, respectively, so that sealed spaces 30A-30D are formed between the first lens 21 including the first lens frame 21A and the sixth lens 26, between the sixth lens 26 and the seventh lens 27, between the seventh lens 27 and the eighth lens 28, and between the eighth lens 28 and the ninth lens 29, respectively.

In the sealed spaces 30A-30D, valves 31A 31D 31D provided in the lens barrel 20 are opened as required to fill gas such as nitrogen $N_2$ or helium He through the valves 31A-31D.

A recess is formed for each of the sealed spaces 30A-30D in the lens barrel 20, and deoxidation agents 32A-32D are provided in the recesses.

The deoxidation agents 32A-32D serve to absorb oxygen in the sealed spaces 30A-30D after the assembly of the lenses. Thus, even if the oxygen concentration is 21% at the assembling of the beam expander 10 in air, it can be reduced to 0.01% or less in the actual use state.

Even if oxygen penetrates into the sealed spaces 30A-30D through clearances at a very small rate, the deoxidation agents 32A-32D always absorb oxygen so that the oxygen concentration in the sealed spaces 30A-30D is always kept at or less than 0.01%.

Accordingly, when the laser beam L1 emitted from the excimer laser 2 passes through the beam expander 10, there is little oxygen in the sealed spaces 30A-30D and the loss of the laser energy by the absorption of oxygen or the generation of noxious gas such as ozone is prevented.

In practice, when the beam expander 10 is assembled in air, oxygen in air is absorbed by the deoxidation agents 32A-32D and the pressures in the sealed spaces 30A-30D become lower than that of an external space so that a refractive index may change by the pressure difference.

In the beam expander 10 of the present embodiment, the valves 31A-31D are opened while oxygen in the sealed spacers 30A-30D is absorbed, and gas such as nitrogen $N_2$ or helium He is filled into the sealed spaces 30A-30D to the volume corresponding to the reduced volume of oxygen so that the change of refractive index due to the pressure difference between the external space and the sealed spaces 30A-30D is prevented.

In the laser exposure apparatus of the present embodiment, the relay lens system 3 and other lenses of the first illumination optical system 5a (for example, the condenser lens 12) also comprise multiple lenses as the beam expander 10 does. Deoxidation agents are also provided in sealed spaces formed in the lens barrel for holding such multiple lenses, as it is for the beam expander 10 of FIG. 3. Those spaces are in nitrogen $N_2$ or helium atmosphere.

In practice, it is possible to purge slight clearances between elements of the relay lens system 3 and the first illumination optical system 5a of the laser exposure apparatus 1 by nitrogen $N_2$ or helium He, but to this end a complex mechanism to evacuate the clearances is required.

Thus, as described above, the deoxidation agent 32 is used for the space sealed by the lens elements in one lens barrel (for example, the lens barrel 20), and only wide spaces between lens barrels are blown by nitrogen $N_2$ or helium He to attain compactness as a whole and prevent the loss of the laser energy of the laser beam L1 generated by the excimer laser 2 by the absorption of oxygen and the generation of noxious gas such as ozone.

In the present embodiment, since the oxygen in the sealed spaces 30A-30D in the lens barrel 20 of the relay lens system 3 and the first illumination optical system 5a is absorbed by the deoxidation agents 32 (32A-32D), the laser exposure apparatus 1 which prevents the loss of the laser energy by the absorption of oxygen, the generation of the noxious gas and the swing due to the change of the transmission even if the laser beam L1 emitted by the ArF excimer laser is passed through the optical system 5, is attained.

In accordance with the present embodiment, since nitrogen $N_2$ or helium He is filled into the sealed space 30 through the valves 31 (31A-31D) provided in the sealed space 30 in the lens barrel 20 of the relay lens system 3 and the first illumination optical system 5a to replace the oxygen absorbed by the deoxidation agent 32, the laser exposure apparatus 1 which effectively avoids the problem of the change of the refractive index due to the pressure difference between the sealed space 30 and the external space, is attained.

In the present embodiment, the deoxidation agent 32 is provided only in the lens barrel 20 to absorb oxygen and the periphery of the lens barrel 20 is kept in the nitrogen $N_2$ or helium He atmosphere. The same effect may be attained by arranging the illumination optical system 5 in a sealed housing and deoxidation agent may be provided in the housing to absorb oxygen.

In the present embodiment, the lens barrel 20 is assembled in air. Alternatively, it may be assembled in nitrogen $N_2$ or helium He atmosphere and the deoxidation agent 32 may be provided to absorb oxygen which penetrates through clearances at a very small rate.

In this case, since the amount of oxygen absorbed by the deoxidation agent is very small, there is little pressure difference between the sealed space of the lens barrel and the external space. Thus, valves are not necessary and the construction is simplified.

In the present embodiment, the argon fluoride excimer laser is used although another laser may be used. In essence, any laser, which generates a laser beam having a spectrum characteristic which substantially overlaps with the absorption band of oxygen may be used to attain the same effect.

In the present embodiment, the laser which generates the laser beam having the spectrum characteristic which substantially overlaps with the absorption band of oxygen is used. Alternatively, a laser which generates a strong laser beam of short wavelength having a spectrum characteristic which does not overlap with the absorption band of oxygen may also be used since the cloud of the optical system is effectively prevented by the absorption of oxygen by the deoxidation agent.

In the present embodiment, the laser exposure apparatus is used to manufacture a semiconductor integrated circuit although the present invention is widely applicable to various laser optical apparatus such as a laser machining apparatus for finely machining by a laser beam or a laser marker apparatus for drawing characters.

In accordance with the present invention, since the oxygen in the sealed space in the lens barrel is absorbed by the deoxidation means, the cloud on the lens surface is prevented even if the laser beam of a short wavelength is used, and the loss of the laser energy by the absorption of oxygen, the generation of the noxious gas and the swing by the change of the transmission are prevented even if the laser beam having the spectrum characteristic which substantially overlaps with the absorption band of oxygen is used.

What is claimed is:

1. A laser optical apparatus, comprising:
    a laser beam source for emitting a laser beam of short wavelength; and
    an optical system including a plurality of lenses through which the laser beam is transmitted, and at least one of which has a surface coated with a material which is reactive to the laser beam in an oxygen atmosphere to cause clouding of said surface,
    said lenses being housed in a lens barrel with said coated surface disposed in a hermetically sealed inter-lens space provided with a deoxidizer for absorbing oxygen from said space to prevent said clouding of said lens surface.

2. A laser optical apparatus according to claim 1, wherein the laser beam has a spectrum characteristic which substantially overlaps with an absorption band of oxygen.

3. A laser optical apparatus according to claim 1, wherein said laser beam source is an argon fluoride excimer laser having a spectrum characteristic which substantially overlaps with an absorption band of oxygen.

4. A laser optical apparatus according to claim 1, wherein said optical system is arranged in a hermetically sealed space provided with a deoxidizer for absorbing oxygen therefrom.

5. A laser optical apparatus according to claim 1, wherein a valve communicating with an external space is provided in communication with said inter-lens space, and gas other than oxygen is filled into said inter-lens space through said valve to substitute for oxygen absorbed by said deoxidizer.

6. A projection exposure apparatus for transferring a pattern image of a reticle onto a photosensitive substrate, comprising:
    a laser beam source for emitting a laser beam of short wavelength;
    an illumination optical system, including a plurality of lenses, for illuminating said reticle with said laser beam; and
    a projection optical system, including a plurality of lenses, for projecting an image of said reticle onto said photosensitive substrate,
    the plurality of lenses of at least one of said illumination optical system and said projection optical system including a lens surface coated witch a material which is reactive to the laser beam in an oxygen atmosphere to cause clouding of the lens surface, and being housed in a lens barrel with said lens surface disposed in a hermetically sealed inter-lens space provided with a deoxidizer for absorbing oxygen from said space to prevent said clouding of said lens surface.

7. A projection exposure apparatus according to claim 6, wherein said laser beam has a spectrum characteristic which substantially overlaps with an absorption band of oxygen.

8. A projection exposure apparatus according to claim 6, wherein said laser beam source is an argon fluoride excimer laser having a spectrum characteristic which substantially overlaps with an absorption band of oxygen.

9. A projection exposure apparatus according to claim 6, wherein at least one of said illumination optical system and said projection optical system is arranged in a hermetically sealed space provided with a deoxidizer for absorbing oxygen therefrom.

10. A projection exposure apparatus according to claim 6, wherein a valve communicating with an external space is provided in communication with said inter-lens space, and gas other than oxygen is filled into said inter-lens space through said valve to substitute for oxygen absorbed by said deoxidizer.

11. A laser optical apparatus, comprising:
    a laser beam source for emitting a laser beam of short wavelength; and
    an optical system including an optical element through which said laser beam is transmitted and which has a surface coated with a material which is reactive to the laser beam in an oxygen atmosphere to cause clouding of said coated surface, said optical element having said coated surface disposed in a hermetically sealed space provided with a deoxidizer for absorbing oxygen from said space to prevent said clouding of said coated surface.

12. A projection exposure apparatus for transferring a pattern image of a reticle onto a photosensitive substrate, comprising:

a light source for emitting light to illuminate said reticle, said light being of a wavelength tending to cause formation of ozone by a reaction of oxygen in an oxygen atmosphere; and an illumination optical system, including an optical integrator and a condensing optical system, for producing a plurality of images of said light source between said optical integrator and 8aid condensing optical system, and for illuminating said reticle with a uniform illumination light from said images of said light source through said condensing optical system, said illumination optical system being housed in a hermetically sealed housing provided with a deoxidizer for absorbing oxygen from within said housing to prevent the formation of ozone gas by a reaction of oxygen with said light within said housing.

13. A projection exposure apparatus according to claim 12, wherein said light source emits light having a spectrum characteristic which substantially overlaps with an absorption band of oxygen.

14. A projection exposure apparatus according to claim 12, wherein said light source includes an argon fluoride excimer laser having a spectrum characteristic which substantially overlaps with an absorption band of oxygen.

15. A projection exposure apparatus according to claim 12, wherein said light source emits ultraviolet light.

16. An optical apparatus, comprising:

a light source for emitting light of a wavelength tending to cause formation of ozone by a reaction of oxygen in an oxygen atmosphere; and an optical system through which said light is transmitted, said optical system being housed in a hermetically sealed housing provided with a deoxidizer for absorbing oxygen from within said housing to prevent the formation of ozone gas by a reaction of oxygen with said light within said housing.

17. An optical apparatus according to claim 16, wherein said light source emits light having a spectrum characteristic which substantially overlaps with an absorption band of oxygen.

18. An optical apparatus according to claim 16, wherein said light source includes an argon fluoride excimer laser having a spectrum characteristic which substantially overlaps with an absorption band of oxygen.

19. An optical apparatus according to claim 16, wherein said light source emits ultraviolet light.

* * * * *